(12) United States Patent
Tatsuta et al.

(10) Patent No.: US 11,353,488 B2
(45) Date of Patent: Jun. 7, 2022

(54) RADIO WAVE MEASUREMENT METHOD

(71) Applicant: PANASONIC CORPORATION, Osaka (JP)

(72) Inventors: Akihiro Tatsuta, Kyoto (JP); Takuya Asada, Osaka (JP); Taichi Hamabe, Kanagawa (JP); Teppei Emura, Osaka (JP)

(73) Assignee: PANASONIC CORPORATION, Osaka (JP)

(*) Notice: Subject to any disclaimer, the term of this patent is extended or adjusted under 35 U.S.C. 154(b) by 91 days.

(21) Appl. No.: 17/024,318

(22) Filed: Sep. 17, 2020

(65) Prior Publication Data

US 2021/0003624 A1 Jan. 7, 2021

Related U.S. Application Data

(63) Continuation of application No. PCT/JP2019/010116, filed on Mar. 12, 2019.

(30) Foreign Application Priority Data

Mar. 23, 2018 (JP) .............................. JP2018-056872

(51) Int. Cl.
*G01R 31/00* (2006.01)
*G01R 29/08* (2006.01)

(52) U.S. Cl.
CPC ..... *G01R 29/0871* (2013.01); *G01R 29/0892* (2013.01); *G01R 29/0835* (2013.01)

(58) Field of Classification Search
USPC ................................................ 324/637, 638
See application file for complete search history.

(56) References Cited

U.S. PATENT DOCUMENTS 6,163,292 A   12/2000  Liedtke et al.
6,246,354 B1   6/2001  Liedtke et al.
(Continued)

FOREIGN PATENT DOCUMENTS

DE   19915017 A1   5/2000
EP    3136757 A1   3/2017
(Continued)

OTHER PUBLICATIONS

Hiro Shida, "The Measuring Method of EM Shield Effects at Construction Site," Architectural Institute of Japan, Jul. 2002; with partial English translation and Concise Explanation of Relevance.
(Continued)

*Primary Examiner* — Vincent Q Nguyen
(74) *Attorney, Agent, or Firm* — McDermott Will & Emery LLP (57) ABSTRACT

A radio wave measurement method used in a transmitter and a receiver, includes transmitting a radio wave from the transmitter, receiving the radio wave by the receiver through a scatterer, measuring, a plurality of times, reception qualities of the radio waves received by the reception antenna of the main reception surface and received respectively by the reception antennas of the plurality of sub-reception surfaces while changing a position of the receiver, and determining a position of the receiver when the reception quality of the radio wave corresponding to the reception antenna of the main reception surface and the reception qualities of the radio waves corresponding to the plurality of sub-reception surfaces satisfy a predetermined condition as a measurement position used for derivation of a material constant of the scatterer.

4 Claims, 9 Drawing Sheets

(56) References Cited

U.S. PATENT DOCUMENTS

| | | | |
|---|---|---|---|
| 6,366,232 B1 | 4/2002 | Liedtke et al. | |
| 2007/0276540 A1* | 11/2007 | Okuda | G05D 1/0272 340/5.1 |
| 2018/0351631 A1 | 12/2018 | Hamabe et al. | |

FOREIGN PATENT DOCUMENTS

| | | |
|---|---|---|
| JP | 2010-197316 A | 9/2010 |
| JP | 2012-093223 A | 5/2012 |
| JP | 2017-003306 A | 1/2017 |
| WO | 2006/129370 A1 | 12/2006 |
| WO | 2017/134715 A1 | 8/2017 |

OTHER PUBLICATIONS

Tetsuro Imai, "Mobile Radio Propagation Simulation Based on Ray-Tracing Method," Journal of the Institute of Electronics, Information, and Communication Engineers B, vol. J92-B, No. 9, pp. 1333-1347, Sep. 2009; with partial English translation and Concise Explanation of Relevance.

ITU-R Radiocommuniction Sector of ITU, "Effects of building materials and structures on radiowave propagation above 100 MHz", Recommendation ITU-R p. 2040-1, pp. 2-23, Jul. 2015.

International Search Report issued in International Patent Application No. PCT/JP2019/010116, dated May 21, 2019; with English translation.

Gianni Giorgetti, et al., "Single-Anchor Indoor Localization Using a Switched-Beam Antenna," IEEE Communications Letters, Jan. 2009, vol. 13, No. 1, pp. 58-60.

M. Rzymowski, et al. "Single-Anchor Indoor Localization Using ESPAR Antenna," IEEE Antennas and Wireless Propagation Letters, 2016, vol. 15, pp. 1183-1186.

Stefano Maddio, et al. "Direction of Arrival Estimation of an Arbitraty Oriented Targets by a Highly Directive Antenna and Coarse RSSI Data," Proceedings of the 42nd European Microwave Conference, Oct. 29-Nov. 1, 2012, Amsterdam, The Netherlands, pp. 140-143.

Alessandro Cidronali, et al. "Analysis and Performance of a Smart Antenna for 2.45-GHz Single-Anchor Indoor Positioning," IEEE Transactions on Microwave Theory and Techniques, Jan. 2010, vol. 58, No. 1, pp. 21-31.

Extended European Search Report issued in European Patent Application No. 19770363.0, dated Apr. 13, 2021.

* cited by examiner

FIG. 9

RADIO WAVE MEASUREMENT METHOD

CROSS-REFERENCE OF RELATED APPLICATIONS

This application is a Continuation of International Patent Application No. PCT/JP2019/010116, filed on Mar. 12, 2019, which in turn claims the benefit of Japanese Application No. 2018-056872, filed on Mar. 23, 2018, the entire disclosures of which Applications are incorporated by reference herein.

BACKGROUND OF THE INVENTION

1. Field of the Invention

The present disclosure relates to a radio wave measurement method for measuring a radio wave environment in a measurement target area.

2. Description of the Related Art

Non-Patent Literature 1 discloses a technology for evaluating EM shield effects at a construction site by near-field measurement, far-field measurement, and transmission loss method measurement that use a measurement apparatus including a signal generator, an antenna, and a reception device. An electromagnetic shielding technology for a building is used in various fields such as prevention of malfunction of a factory robot or the like, malfunction of an electronic device, prevention of leakage of confidential information, prevention of incoming/outgoing calls from a mobile phone, prevention of radio interference such as wireless (wireless microphone), and the like.

Non-Patent Literature 1: HIRO SHIDA, "The Measuring Method of EM Shield Effects at Construction Site", Architectural Institute of Japan, July 2002

Non-Patent Literature 2: Tetsuro IMAI, "Mobile Radio Propagation Simulation Based on Ray-Tracing Method", Journal of the Institute of Electronics, Information, and Communication Engineers B, Vol. J92-B, No. 9, pp. 1333-1347, September 2009

Non-Patent Literature 3: ITU-R Radiocommuniction Sector of ITU, "Effects of building materials and structures on radiowave propagation above 100 MHz", Recommendation ITU-R P.2040-1, pp. 2-23, July, 2015

SUMMARY OF THE INVENTION

The present disclosure has been devised in view of the above-described situation in the related art, and an object thereof is to provide a radio wave measurement method that determines a proper position of a receiver that receives radio waves from a transmitter through a scatterer disposed in a model area of a measurement target, and facilitates derivation of a material constant of the scatterer used in a simulation according to an actual environment as well as improvement in simulation accuracy.

The present disclosure provides a radio wave measurement method in which a transmitter and a receiver are used, the receiver comprising a housing of a polyhedron that includes one main reception surface and a plurality of sub-reception surface, wherein a reception antenna is provided on the one main reception surface and different reception antennas are provided on the plurality of sub-reception surface, the radio wave measurement method comprising steps of: transmitting a radio wave from the transmitter; receiving the radio wave by the receiver through a scatterer; measuring, a plurality of times, reception qualities of the radio waves received by the reception antenna of the main reception surface and received respectively by the reception antennas of the plurality of sub-reception surfaces while changing a position of the receiver; and determining a position of the receiver when the reception quality of the radio wave corresponding to the reception antenna of the main reception surface and the reception qualities of the radio waves corresponding to the plurality of sub-reception surfaces satisfy a predetermined condition as a measurement position used for derivation of a material constant of the scatterer.

According to the present disclosure, since the proper position of the receiver that receives radio waves from the transmitter through the scatterer disposed in the model area of the measurement target can be determined, the derivation of the material constant of the scatterer used in the simulation according to the actual environment as well as the improvement in the simulation accuracy can be facilitated.

DETAILED DESCRIPTION OF THE EXEMPLARY EMBODIMENTS

Background to Contents of First Embodiment

Non-Patent Literature 2 discloses a ray-tracing method in which a measurement target area of a radio wave environment is set as a model area and each radio wave environment at a point in the model area is simulated by calculation. The larger the model area, the more time it takes to actually measure the radio wave environments in that area. Therefore, it is considered meaningful to evaluate a radio wave environment at a point in the model area by a simulation.

When the ray-tracing method is used, if material constants (for example, reflectance or transmittance of radio waves) of various scatterers (for example, a wall of a concrete structure or the like, wood, a metal desk) arranged in the model area (for example, factory) are properly set, simulation accuracy is improved. However, for the material constants of the scatterers arranged in the model area, for example, it is not always suitable to use a default value for each type of scatterers disclosed in Non-Patent Literature 3. For example, when the model area is a factory, since there are various types of scatterers arranged in the factory, simulation accuracy may not be expected to improve unless proper material constants according to an actual environment are used. Although above-described Non-Patent Literature 1 discloses that the electromagnetic shielding performance of the building site is measured, since a method for properly obtaining the material constants of the scatterers actually arranged in a factory or the like is not mentioned, it is considered that a similar problem as described above exists.

Therefore, in the following first embodiment, an example of a radio wave measurement method will be described which determines a proper position of a receiver that receives radio waves from a transmitter through a scatterer disposed in a model area of a measurement target, and facilitates derivation of a material constant of a scatterer used in a simulation according to an actual environment as well as improvement in simulation accuracy.

Hereinafter, an embodiment specifically disclosing a radio wave measurement method according to the present disclosure will be described in detail with reference to the drawings as appropriate. However, unnecessarily detailed description may be omitted. For example, detailed description of a well-known matter or repeated description of substantially the same configuration may be omitted. This is to avoid unnecessary redundancy in the following description and to facilitate understanding of those skilled in the art. It is to be understood that the accompanying drawings and the following description are provided to enable those skilled in the art to fully understand the present disclosure, and are not intended to limit the range of the claims.

In the following first embodiment, description will be made assuming that a point where a wireless transmitter (an example of a transmitter) is disposed (in other words, transmission point) is provided in a target area (hereinafter, referred to as "area") for a purpose of visualizing a radio wave environment. The area will be described by exemplifying a factory in which a plurality of scatterers are arranged.

In the following description, the radio wave environment is a reception quality at a point in an area calculated in an analysis processing (in other words, simulation) executed by a radio wave environment analysis apparatus (not shown) when radio waves are transmitted (radiated) from the wireless transmitter disposed at the transmission point (see above). The reception quality includes, for example, reception power (in other words, reception electric field strength) and an arrival direction. Therefore, the analysis processing of the radio wave environment is to calculate the reception quality (see above) by executing a simulation of the radio wave environment when radio waves transmitted from the transmission point where the wireless transmitter is disposed are received at points in the area.

Figure 1:
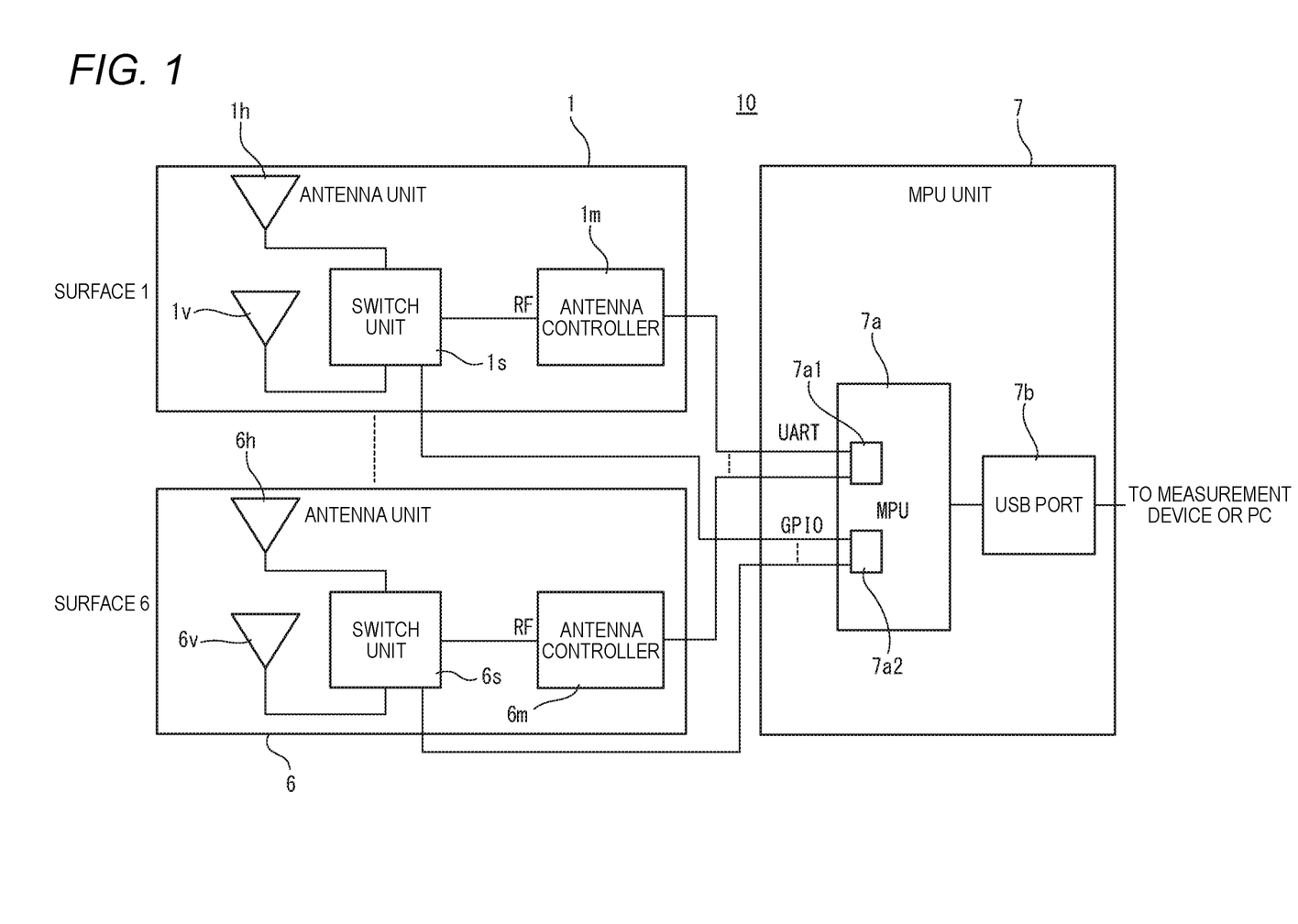
FIG. 1 is a block diagram showing a hardware configuration example of a radio wave measurement apparatus according to a first embodiment.
Figure 2:
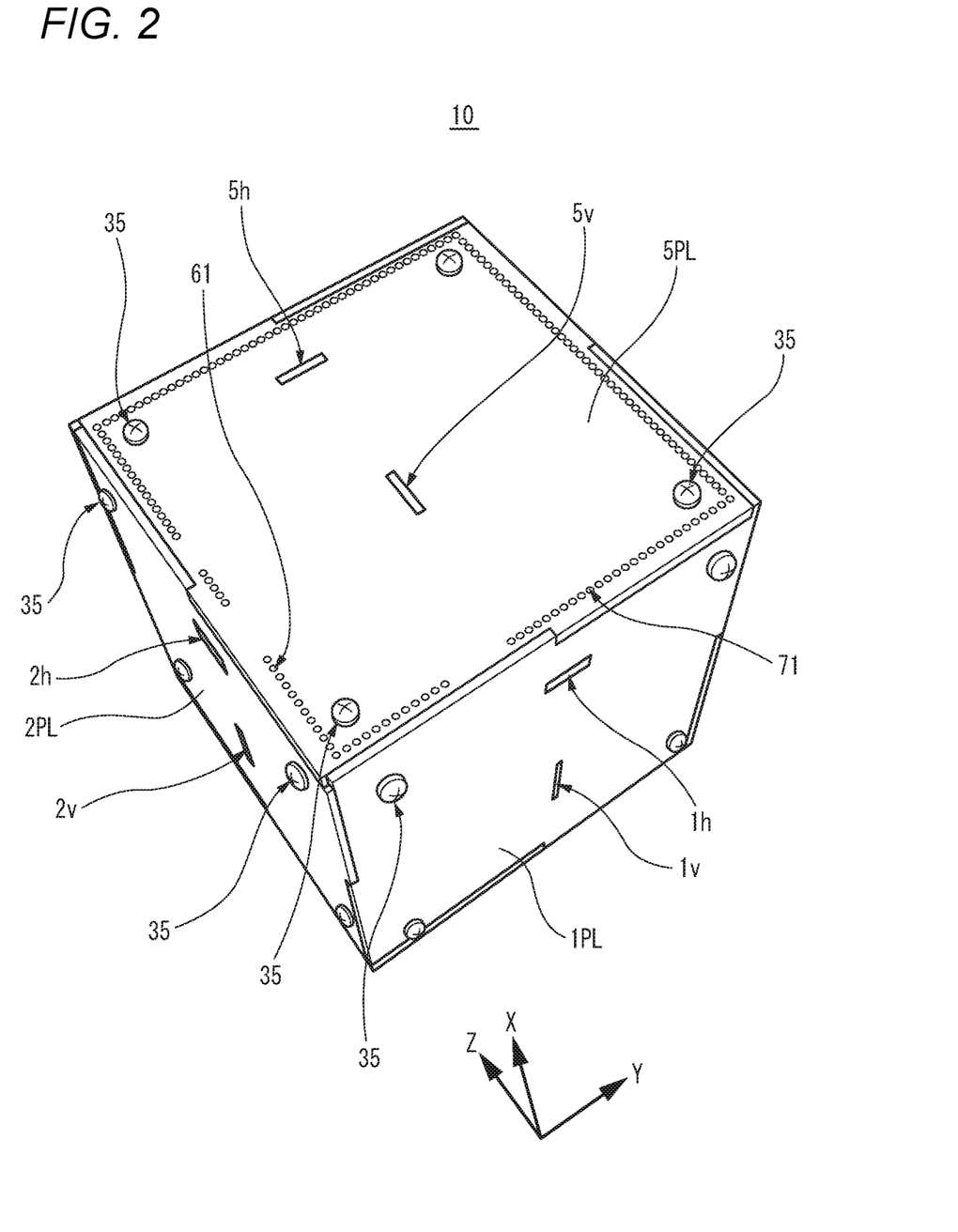
FIG. 2 is a perspective view showing an external appearance of the radio wave measurement apparatus according to the first embodiment.

FIG. 1 is a block diagram showing a hardware configuration example of a radio wave measurement apparatus 10 according to the first embodiment. FIG. 2 is a perspective view showing an external appearance of the radio wave measurement apparatus 10 according to the first embodiment. In the first embodiment, respective directions of an X-axis, a Y-axis, and a Z-axis follow, for example, directions of arrows shown in FIG. 2. Further, for example, a +X direction and a −X direction correspond to an upper-lower direction of a housing of the radio wave measurement apparatus 10, a −Y direction and a +Y direction correspond to a left-right direction of the housing of the radio wave measurement apparatus 10, and −Z direction and +Z direction correspond to a front-rear direction of the housing of the radio wave measurement apparatus 10.

As shown in FIG. 2, the radio wave measurement apparatus 10 includes the quadrangular prism-shaped (for example, a rectangular parallelepiped or a cube) housing, and antenna units 1 to 6 are provided correspondingly on a total of six surfaces (specifically, a front surface 1PL, a left surface 2PL, a rear surface, a right surface, an upper surface 5PL, and a lower surface) that constitute the housing. The housing of the radio wave measurement apparatus 10 is fixed by a pedestal (not shown) directly or by a certain distance from any surface (for example, lower surface), and wheels are provided on the pedestal. Accordingly, the radio wave measurement apparatus 10 can be easily moved when measuring an inside of the area.

As shown in FIG. 1, the radio wave measurement apparatus 10 includes the antenna units 1 to 6 and an MPU unit 7. Since configurations of the antenna units 1 to 6 are the same, the antenna unit 1 will be described as an example here for the sake of simplifying the description. Further, in the following description of the antenna unit 1, the configuration of the antenna unit 1 may be replaced with a corresponding configuration of another antenna unit.

The antenna unit 1 includes a horizontally polarized wave antenna 1*h*, a vertically polarized wave antenna 1*v*, a switch unit 1*s*, and an antenna controller 1*m*.

The horizontally polarized wave antenna 1*h* receives a horizontally polarized wave of radio waves transmitted from a wireless transmitter 10TX (see FIG. 4 or FIG. 5A) disposed in the area, and specifically receives a horizontally polarized wave having a predetermined frequency band (for example, 920 MHz band). The horizontally polarized wave antenna 1*h* is electrically connected to the switch unit 1*s* (not shown in FIG. 2).

The vertically polarized wave antenna 1*v* receives a vertically polarized wave of radio waves transmitted from the wireless transmitter 10TX (see FIG. 4 or FIG. 5A) disposed in the area, and specifically receives a vertically polarized wave having a predetermined frequency band (for example, 920 MHz band). The vertically polarized wave antenna 1*v* is electrically connected to the switch unit 1*s* (not shown in FIG. 2).

The switch unit 1s connects the horizontally polarized wave antenna 1h or the vertically polarized wave antenna 1v to the antenna controller 1m according to a switch switching signal output from a switch switching controller 7a2 of an MPU 7a in a time-division manner for each surface that constitutes the housing of the radio wave measurement apparatus 10. In other words, the switch unit 1s outputs an output of the horizontally polarized wave antenna 1h or the vertically polarized wave antenna 1v to the antenna controller 1m according to the switch switching signal.

The antenna controller 1m is configured using, for example, a wireless signal circuit (module) that complies with a standard that handles a wireless signal of Wi-Sun (registered trademark). The antenna controller 1m extracts the output of the horizontally polarized wave antenna 1h or the vertically polarized wave antenna 1v connected to the switch unit 1s as parallel format data (for example, a reception electric field strength of radio waves transmitted from the wireless transmitter), and outputs the parallel format data to a data conversion unit 7a of the MPU 7a.

The MPU unit 7 includes a micro processing unit (MPU) 7a and a universal serial bus (USB) port 7b.

The MPU 7a functions as a controller of the radio wave measurement apparatus 10, and performs a control processing for generally managing operations of units of the radio wave measurement apparatus 10, an input/output processing of data among the units of the radio wave measurement apparatus 10, a calculation processing of data, and a storage processing of data. The MPU 7a includes the data conversion unit 7a1 and the switch switching controller 7a2.

The data conversion unit 7a1 is configured using, for example, a universal asynchronous receiver/transmitter (UART) circuit, and converts parallel format data output by antenna controllers (for example, antenna controllers 1m to 6m) into serial format data. The data (for example, the reception electric field strength of the radio waves transmitted from the wireless transmitter) is input to a measurement device (for example, a spectrum analyzer or a network analyzer) connected to the radio wave measurement apparatus 10 via the USB port 7b. Further, in the first embodiment, the measurement device may include a personal computer (PC).

The switch switching controller 7a2 time-divisionally generates a switch switching signal for inputting an output of the horizontally polarized wave antenna or the vertically polarized wave antenna on any one of the surfaces of the radio wave measurement apparatus 10 to the MPU unit 7. The switch switching controller 7a2 includes a general-purpose input/output (GPIO) terminal, and outputs the time-divisionally generated switch switching signal to switch units on the surfaces (for example, switch units Is to 6s) via the GPIO terminal. Accordingly, by the switch switching signal, only an output value of any one of antennas can be exclusively input to the MPU 7a periodically in an order of an output of the horizontally polarized wave antenna 1h of the antenna unit 1, an output of the vertically polarized wave antenna 1v of the antenna unit 1, . . . , an output of the horizontally polarized wave antenna 6h of the antenna unit 6, and an output of the vertically polarized wave antenna 6v of the antenna unit 6 every predetermined time.

The USB port 7b connects the radio wave measurement apparatus 10, and the PC or the measurement device (for example, the spectrum analyzer or the network analyzer) (not shown).

Although the above description is an example of a case where the radio wave measurement apparatus 10 receives radio waves, the radio wave measurement apparatus 10 may be considered to have a configuration for transmitting radio waves. That is, the radio wave measurement apparatus 10 may be switched so as to use any one of the antenna units 1 to 6 in a time-division manner, and may further time-divisionally transmit radio waves from a horizontally polarized wave antenna or a vertically polarized wave antenna provided in the antenna unit. Therefore, the wireless transmitter 10TX to be described later can have the same configuration as that of the radio wave measurement apparatus 10.

The PC (not shown) is connected, via a USB cable (not shown), to the radio wave measurement apparatus 10 for receiving radio waves transmitted from the wireless transmitter 10TX (see FIG. 4 or FIG. 5A) in the area. The PC measures and calculates reception power of radio waves at points in the area based on a detection output (for example, a reception electric field strength) of radio waves received by the radio wave measurement apparatus 10. The PC can measure radio wave intensities of a horizontally polarized wave and a vertically polarized wave of each frequency based on detection outputs of a horizontally polarized wave antenna and a vertically polarized wave antenna arranged on each surface of the radio wave measurement apparatus 10. Further, the PC can identify an arrival direction of a reflected wave based on the detection outputs of the horizontally polarized wave antenna and the vertically polarized wave antenna arranged on each surface of the radio wave measurement apparatus 10, and can determine whether an obstacle (scatterer) such as a wall surface absorbs radio waves.

The radio wave measurement apparatus 10 includes, as main components, a laminated substrate serving as a surface material that constitutes each surface, and a frame body provided inside the housing of the radio wave measurement apparatus 10. Laminated substrates and the frame body constitute the housing of the radio wave measurement apparatus 10, which is a polyhedron (for example, a hexahedron). The housing of the radio wave measurement apparatus 10 is, for example, a hexahedron. FIG. 2 exemplifies a case of a cube. The laminated substrate is attached to each surface of the cube by, for example, fixing screws 35.

The surface material that constitutes the housing of the radio wave measurement apparatus 10 is not limited to the laminated substrate. The polyhedron is not limited to the hexahedron, and may be, for example, a tetrahedron or a dodecahedron.

In the radio wave measurement apparatus 10, an antenna (horizontally polarized wave antenna and vertically polarized wave antenna) is provided on each of a laminated substrate disposed on an upper surface 5PL, laminated substrates arranged on four side surfaces (for example, a front surface 1PL, a left surface 2PL, a right surface, and a rear surface), and a laminated substrate disposed on a lower surface. Accordingly, the radio wave measurement apparatus 10 can receive arriving radio waves from a total of six directions. When the radio wave measurement apparatus 10 is fixed to a predetermined placement surface and radio waves are measured, the laminated substrate provided with the antenna may be omitted on the lower surface of the radio wave measurement apparatus 10.

The antenna disposed on each laminated substrate is, for example, a dipole antenna. The dipole antenna is formed, for example, on a laminated substrate, and a pattern of the dipole antenna is formed by etching metal foil on a surface or the like. Each of a plurality of layers is configured with, for example, copper foil or glass epoxy.

On the laminated substrates of the cubic housing of the radio wave measurement apparatus 10, for example, the horizontally polarized wave antennas 1h to 6h of a 920 MHz band and the vertically polarized wave antennas 1v to 6v of a 920 MHz band are provided on surfaces (upper layers).

An artificial magnetic conductor (AMC) is used to configure a laminated substrate. The AMC is an artificial magnetic conductor having perfect magnetic conductor (PMC) characteristics and is formed of a predetermined metal pattern. The AMC is used, so that the antenna of the radio wave measurement apparatus 10 can be disposed in parallel with the laminated substrate, and an overall size can be reduced. Further, the AMC can prevent radio waves from other directions from being received by a ground conductor, and can increase a gain of the antenna.

The radio wave measurement apparatus 10 is provided with a plurality of grounding via conductors 61 aligned in a straight line along each side at edge portions of four sides of a laminated substrate. The grounding via conductors 61 may be arranged to align at equal intervals. Further, the grounding via conductors 61 may be provided with a pitch (interval) sufficient to shield radio waves from an outside of the radio wave measurement apparatus 10 according to a frequency band (in other words, wavelength) corresponding to the antenna conductors arranged on a laminated substrate. The grounding via conductors 61 are provided so as to penetrate from an upper surface to a lower surface of the laminated substrate.

In the radio wave measurement apparatus 10, a laminated substrate is formed in, for example, a square shape. In the laminated substrate, a concave portion and a convex portion are formed in each side portion, with a step portion 71 provided at a center of the side portion as a boundary, in a direction along the side portion. That is, as shown in FIG. 2, the housing of the radio wave measurement apparatus 10 is assembled by fitting concave portions and convex portions of adjacent laminated substrates to each other.

Figure 3:
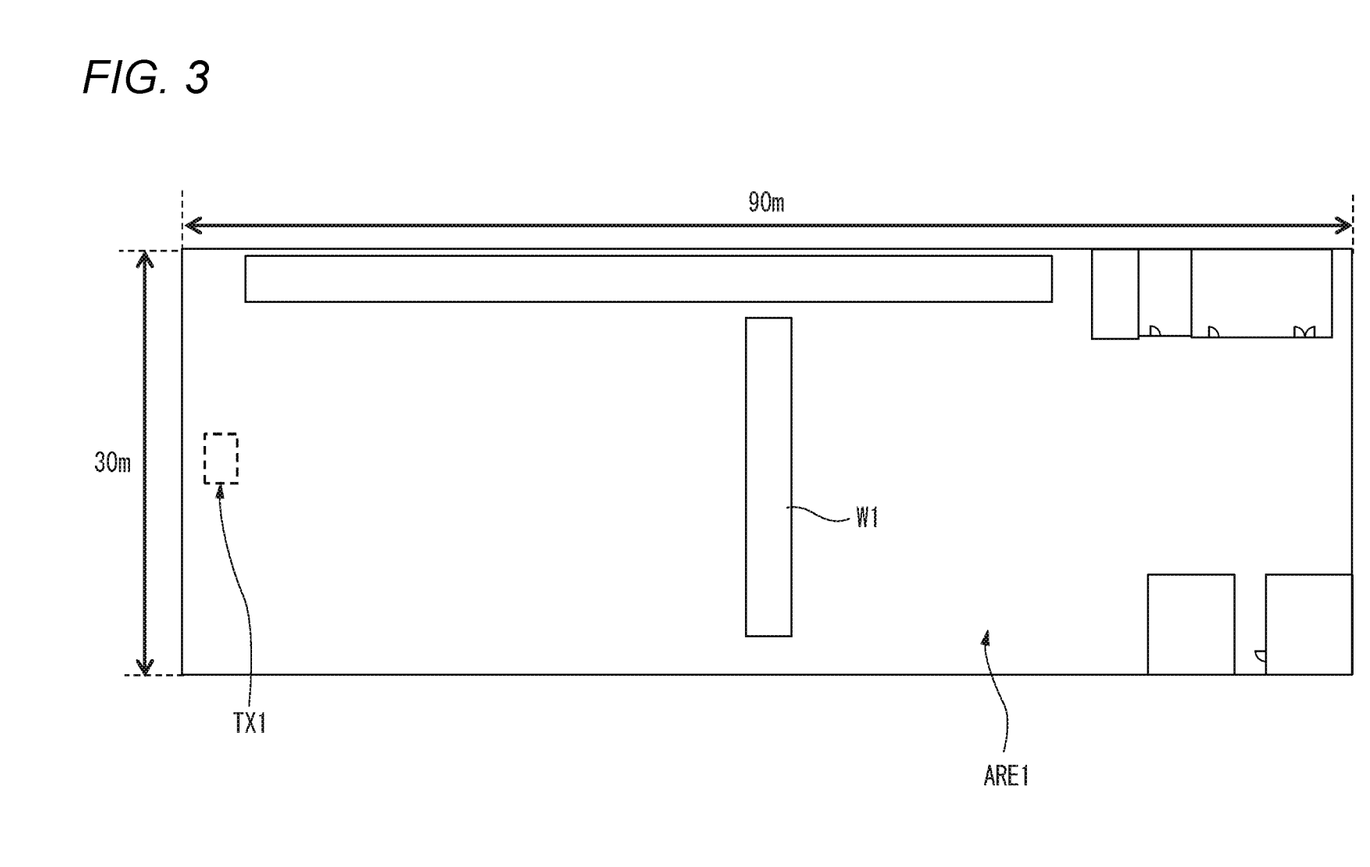
FIG. 3 is a diagram showing an example of an area of a simulation by a radio wave environment analysis apparatus connected to the radio wave measurement apparatus according to the first embodiment.
Figure 4:
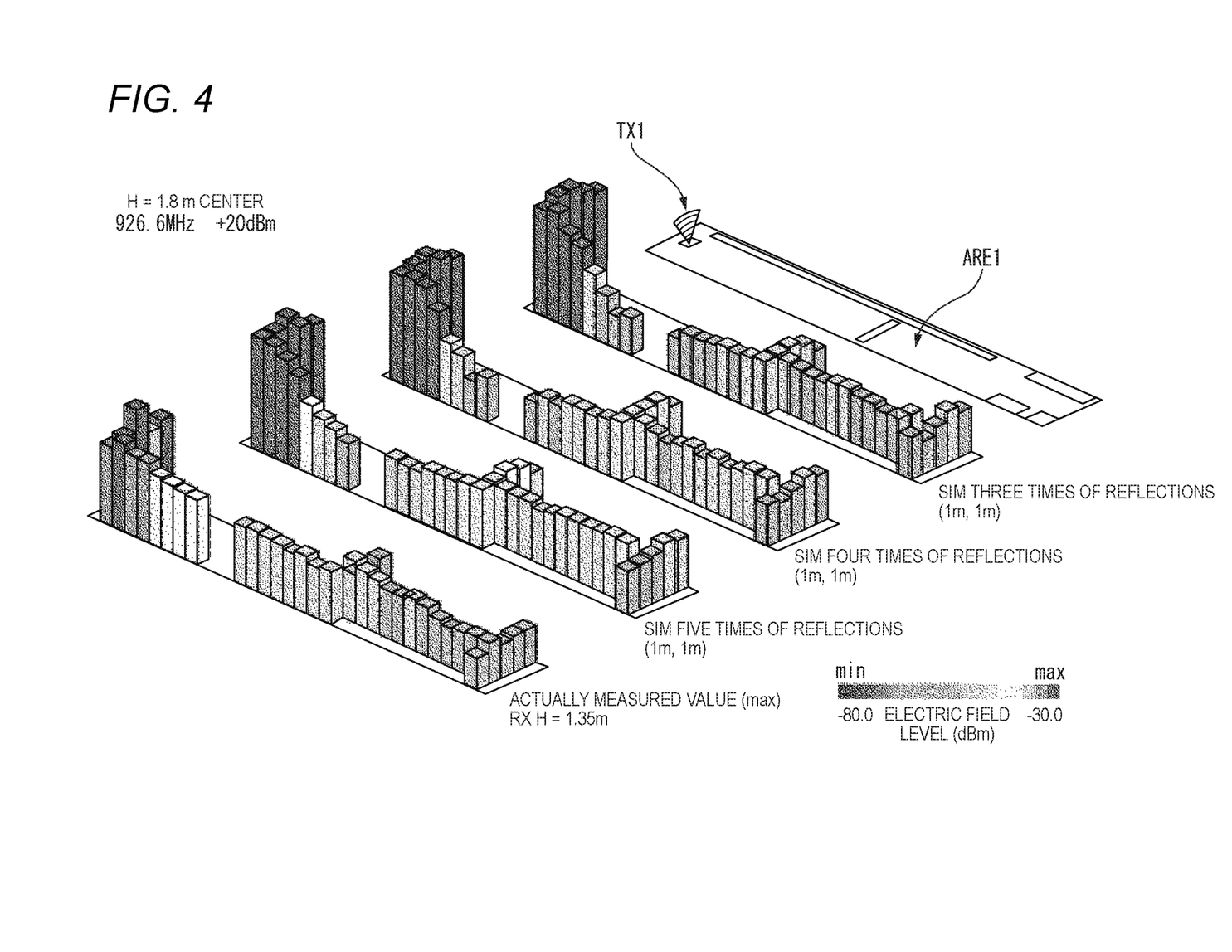
FIG. 4 is a diagram comparatively showing a plurality of simulation results and an actual measurement result of a radio wave environment in the area shown in FIG. 3.

FIG. 3 is a diagram showing an example of an area ARE1 of a simulation by the radio wave environment analysis apparatus connected to the radio wave measurement apparatus 10 according to the first embodiment. FIG. 4 is a diagram comparatively showing a plurality of simulation results and an actual measurement result of a radio wave environment in the area ARE1 shown in FIG. 3. In FIG. 3, a plan view of the area ARE viewed from above is shown.

As shown in FIG. 3, the area ARE1 is a large factory having an area of, for example, 30 m*90 m (*: multiplication operator), and the wireless transmitter 10TX is disposed at a position of a predetermined height (for example, 180 cm from a floor surface) on one end side of the area ARE1. Further, a wall W1 that is an example of a scatterer is disposed at a substantial center of the area ARE1.

Although not shown in FIG. 3, for example, not only the wall W1 but also a large number of types of scatterers (that is, objects through which radio waves are transmitted or on which the radio waves are reflected) are arranged in the factory. When the area ARE1 that is the large factory is to be simulated, as a material constant of each scatterer disposed in the area ARE1, for example, if a default value of a material constant of each scatterer disclosed in Non-Patent Literature 3 is used as it is, the material constant may not be suitable for an actual environment of the area ARE1 or the like. In this case, the simulation accuracy will deteriorate.

Figure 5A:
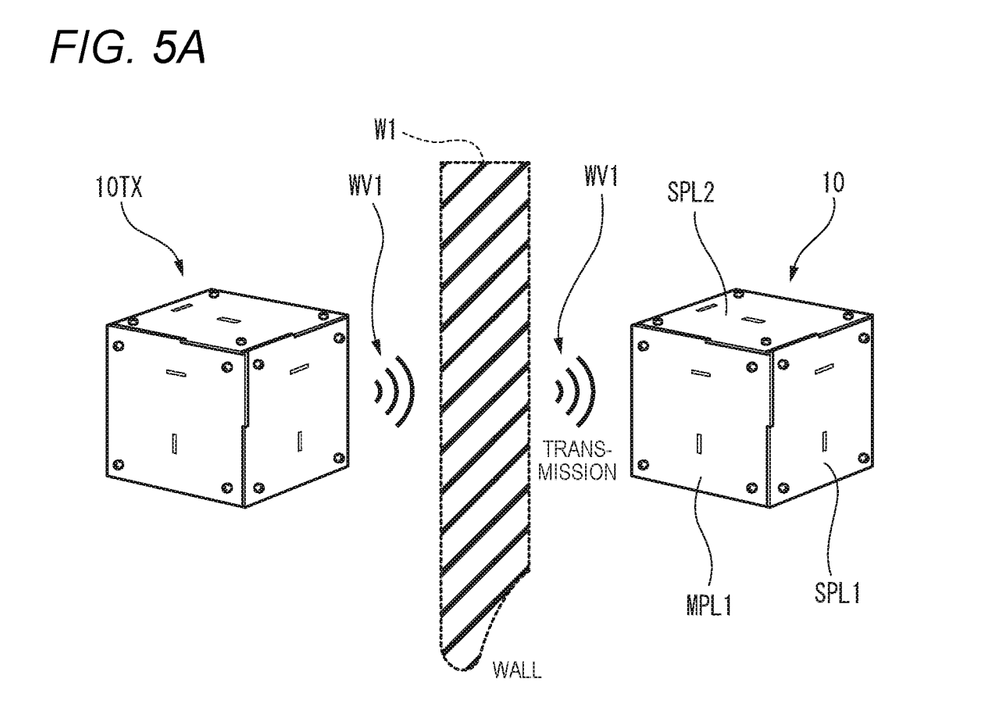
FIG. 5A is an illustrative diagram showing an operation outline example of the radio wave measurement method using the radio wave measurement apparatus according to the first embodiment as a receiver.

Therefore, in the radio wave measurement method according to the first embodiment, in order to properly obtain a material constant of a scatterer (for example, the wall W1), the wireless transmitter 10TX that is an example of a transmitter and the radio wave measurement apparatus 10 that is an example of a receiver are arranged to face each other with the wall W sandwiched therebetween (that is, through the wall) (see FIG. 5A). Further, the wireless transmitter 10TX is positioned on a side opposite to a position of the wall W1 with respect to the radio wave measurement apparatus 10, and radio waves transmitted from the wireless transmitter 10TX are received by the radio wave measurement apparatus 10 through the wall while changing a position of the radio wave measurement apparatus 10 on a reception side (see FIG. 5A). During the reception, when an arrangement position of the radio wave measurement apparatus 10 is disposed at a position that properly faces the wireless transmitter 10TX, radio waves having a high reception electric field strength can be received on a surface of the radio wave measurement apparatus 10 that faces the wall W1. Accordingly, based on an output of the radio wave measurement apparatus 10, the measurement device (see the above) can properly measure a loss of radio waves received by the radio wave measurement apparatus 10 due to the wall W1. Further, by using a known technology (for example, a hall antenna method), a radio wave loss due to transmission through the wall W1 is used, so that a proper material constant of the wall W1 according to an actual environment is obtained, and since the material constant can be set and used as a parameter in a simulation (for example, the ray-tracing method disclosed in Non-Patent Literature 2), the simulation accuracy can be improved.

FIG. 4 shows the area ARE1 shown in FIG. 3, simulation results REF3, REF4, and REF5 of a radio wave environment calculated by the radio wave environment analysis apparatus (not shown) based on the number of times of reflections using the area ARE1 as a target, and a measurement result MSR1 of a radio wave environment actually measured while moving the area ARE1 by using the radio wave measurement apparatus 10. In both the simulations and the actual measurement of the radio wave environment, a reception electric field strength (electric field level) of radio waves is large at a point around one end side (transmission point) of the area ARE1 where the wireless transmitter 10TX is placed, and the reception electric field strength (electric field level) of the radio waves is decreased as a distance from the transmission point is increased.

In the simulations and the actual measurement of the radio wave environment, the wireless transmitter 10TX is placed, for example, at a position having a height (that is, 1.8 m from a floor surface) on one end side of the area ARE1, and radio waves having a frequency of 926.6 MHz are transmitted with an intensity of +20 dBm. Further, in the actual measurement of the radio wave environment, the radio wave measurement apparatus 10 on the reception side is placed so as to be positioned at a height of 1.35 m from the floor surface.

The number of times of reflections is used as a parameter in a simulation of the radio wave environment using, for example, the ray-tracing method disclosed in Non-Patent Literature 2. That is, the number of times of reflections indicates the number of times radio waves are reflected by a scatterer disposed in the area ARE1 before reaching a target point in the area ARE1 from a position of the wireless transmitter 10TX. As shown in FIG. 4, as the number of times of reflections is increased to three times, four times and five times, a simulation result gradually approaches the actually measured measurement result MSR1 of the radio wave environment, and therefore the simulation accuracy is improved. However, calculation for obtaining the simulation result takes a considerable amount of time, and convenience of a user deteriorates.

Therefore, even when the number of times of reflections is small (in other words, without increasing the number of times of reflections), the above-described radio wave measurement method is executed such that a simulation result close to the actually measured measurement result MSR1 of the radio wave environment is obtained. That is, in order to obtain a proper (that is, according to the environment of the area ARE1 such as an actual factory) material constant of each scatterer placed in the area ARE1, positioning of the radio wave measurement apparatus 10 on the reception side when measuring a loss in each scatterer is important.

Figure 5B:
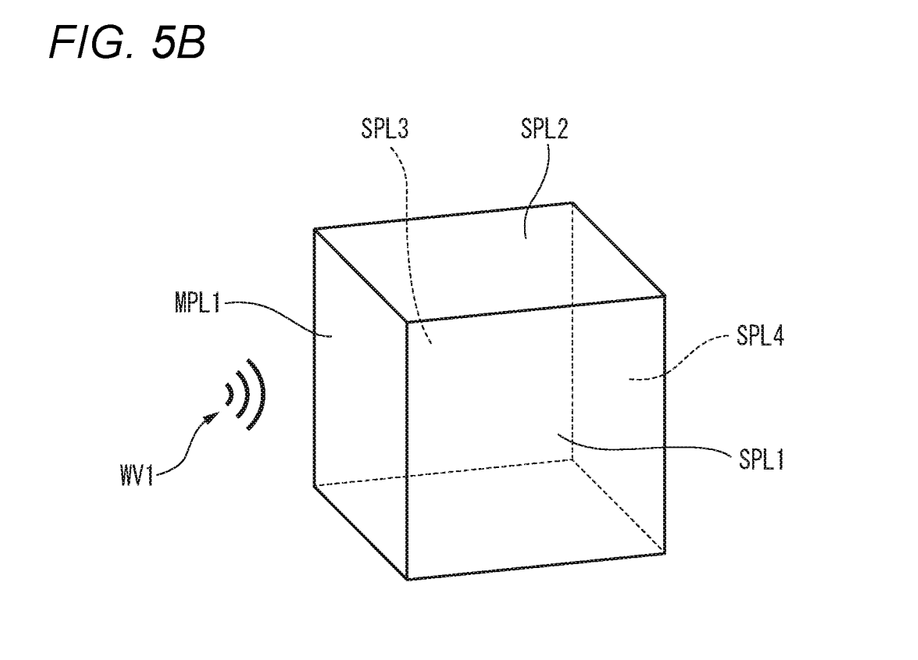
FIG. 5B is an illustrative diagram of a main reception surface and a plurality of sub-reception surfaces.

Next, an operation outline of the radio wave measurement method according to the first embodiment will be described with reference to FIGS. 5A, 5B, 6A, 6B, 7A, 7B, 8A, 8B, and 9. FIG. 5A is an illustrative diagram showing an operation outline example of the radio wave measurement method using the radio wave measurement apparatus 10 according to the first embodiment as the receiver. FIG. 5B is an illustrative diagram of a main reception surface MPL1 and a plurality of sub-reception surfaces SPL1, SPL2, SPL3, and SPL4.

As shown in FIG. 5A, the wireless transmitter 10TX that is an example of the transmitter and the radio wave measurement apparatus 10 that is an example of the receiver are arranged with the wall W1, which is an example of a scatterer disposed in the area ARE1 such as the factory, sandwiched therebetween. Radio waves WV1 having a frequency of, for example, 920 MHz band are transmitted from the wireless transmitter 10TX. The radio waves WV1 are transmitted through the wall W1 that is the scatterer, and are received by the main reception surface MPL1 and the plurality of sub-reception surfaces SPL1, SPL2, SPL3, and SPL4 of the radio wave measurement apparatus 10 (see FIGS. 5A and 5B).

Here, as shown in FIG. 5B, the main reception surface MPL1 is a surface of the six surfaces of the radio wave measurement apparatus 10 that faces or substantially faces the wall W1 as compared with other surfaces. Therefore, a reception electric field strength of the radio waves WV1 that have been transmitted through the wall W1 is maximized on the main reception surface MPL1 and is smaller than the reception electric field strength of the main reception surface MPL1 on other surfaces (that is, sub-reception surfaces).

Figure 6A:
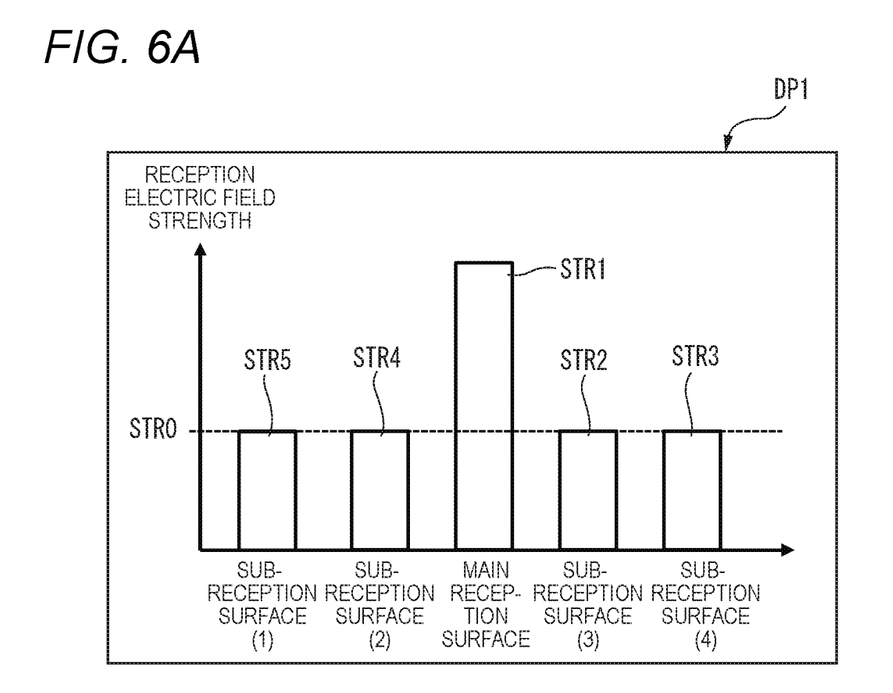
FIG. 6A is a diagram in which a graph is shown on a display unit. The graph shows an example of reception electric field strengths of radio waves received on the main reception surface and the plurality of sub-reception surfaces when the receiver is held at a proper position.
Figure 6B:
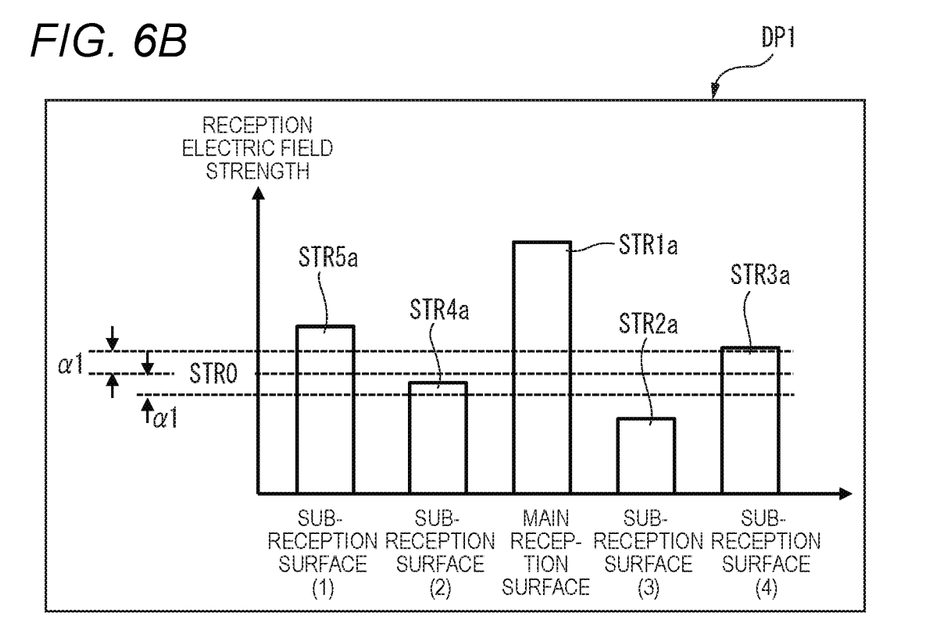
FIG. 6B is a diagram in which a graph is shown on the display unit. The graph shows an example of reception electric field strengths of the radio waves received on the main reception surface and the plurality of sub-reception surfaces when the receiver is not held at the proper position.

FIG. 6A is a diagram in which a graph is shown on a display unit DPI. The graph shows an example of reception electric field strengths of radio waves received on the main reception surface MPL1 and the plurality of sub-reception surfaces SPL1 to SPL4 when the receiver is held at a proper position. FIG. 6B is a diagram in which a graph is shown on the display unit DP1. The graph shows an example of reception electric field strengths of the radio waves received on the main reception surface MPL1 and the plurality of sub-reception surfaces SPL1 to SPL4 when the receiver is not held at the proper position. The display unit DPI is a display that is configured using, for example, a liquid crystal display (LCD), and is connected to or mounted on the measurement device (not shown). A measurement result of the measurement device is displayed on the display unit DP.

As shown in FIG. 5A, when the transmitter (that is, the wireless transmitter 10TX) and the receiver (that is, the radio wave measurement apparatus 10) are arranged to face each other with the wall W1 sandwiched therebetween, the radio waves WV1 transmitted through the wall W1 are mainly received on the main reception surface MPL1 and are received on other surfaces (that is, the sub-reception surfaces SPL1 to SPL4) by further going around from the main reception surface MPL1.

Therefore, as shown in FIG. 6A, the reception electric field strengths of the reception surfaces of the radio wave measurement apparatus 10 measured by the PC (not shown) connected to the radio wave measurement apparatus 10 satisfy the following predetermined conditions. The predetermined conditions are that a reception electric field strength STR1 of the main reception surface MPL1 is greater than each of reception electric field strengths STR2, STR3, STR4, and STR5 of other surfaces (that is, the sub-reception surfaces SPL1 to SPL4), and differences of the reception electric field strengths STR2, STR3, STR4, and STR5 are within a predetermined value α1 (see FIG. 6A). In FIGS. 6A and 6B, a sub-reception surface (1), a sub-reception surface (2), a sub-reception surface (3), and a sub-reception surface (4) correspond to the sub-reception surfaces SPL1, SPL2, SPL3, and SPL4, respectively. An average value STR0 indicates an average value of the reception electric field strengths STR2, STR3, STR4, and STR5 of the sub-reception surfaces.

On the other hand, when the transmitter (that is, the wireless transmitter 10TX) and the receiver (that is, the radio wave measurement apparatus 10) are not arranged to face each other with the wall W sandwiched therebetween, the radio waves WV transmitted through the wall W1 are not always mainly received on the main reception surface MPL1, and the reception electric field strengths STR2, STR3, STR4, and STR5 of other surfaces (that is, the sub-reception surfaces SPL1 to SPL4) are also not uniform.

Therefore, as shown in FIG. 6B, although the reception electric field strength STR1$a$ is greater than each of the reception electric field strengths STR2$a$, STR3$a$, STR4$a$, and STR5$a$, differences among the reception electric field strengths STR2$a$, STR3$a$, STR4$a$, and STR5$a$ are not within the predetermined value α1. That is, since the predetermined conditions are not satisfied, it can be said that the transmitter (that is, the wireless transmitter 10TX) and the receiver (that is, the radio wave measurement apparatus 10) are not arranged to face each other with the wall W1 sandwiched therebetween.

Figure 7A:
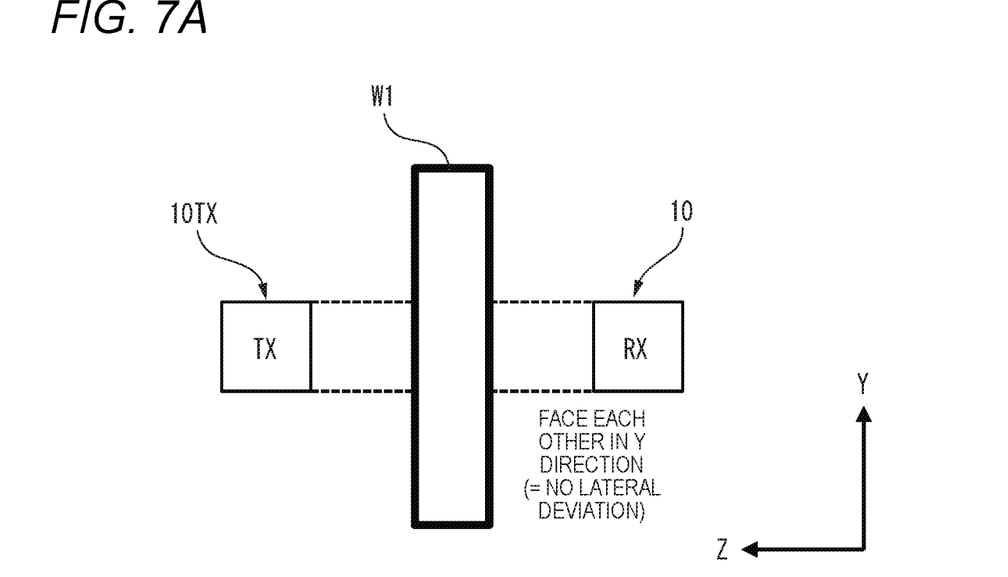
FIG. 7A is a YZ plan view showing an example of a positional relationship between a transmitter and the receiver when the receiver is held at the proper position.
Figure 7B:
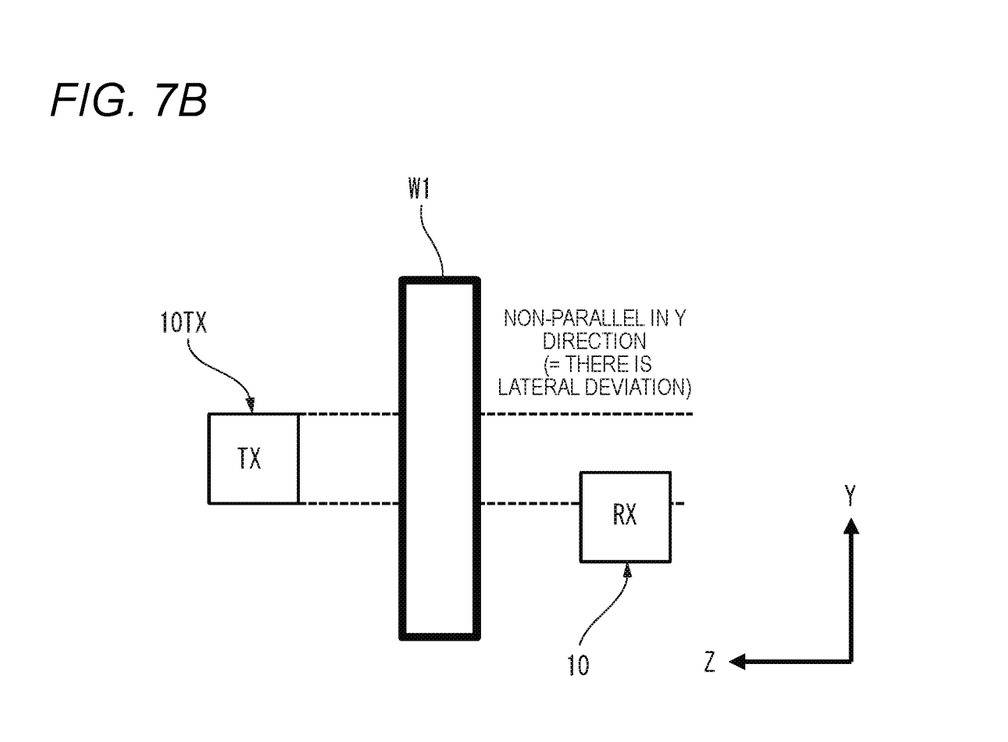
FIG. 7B is a YZ plan view showing an example of the positional relationship between the transmitter and the receiver when the receiver is not held at the proper position.
Figure 8A:
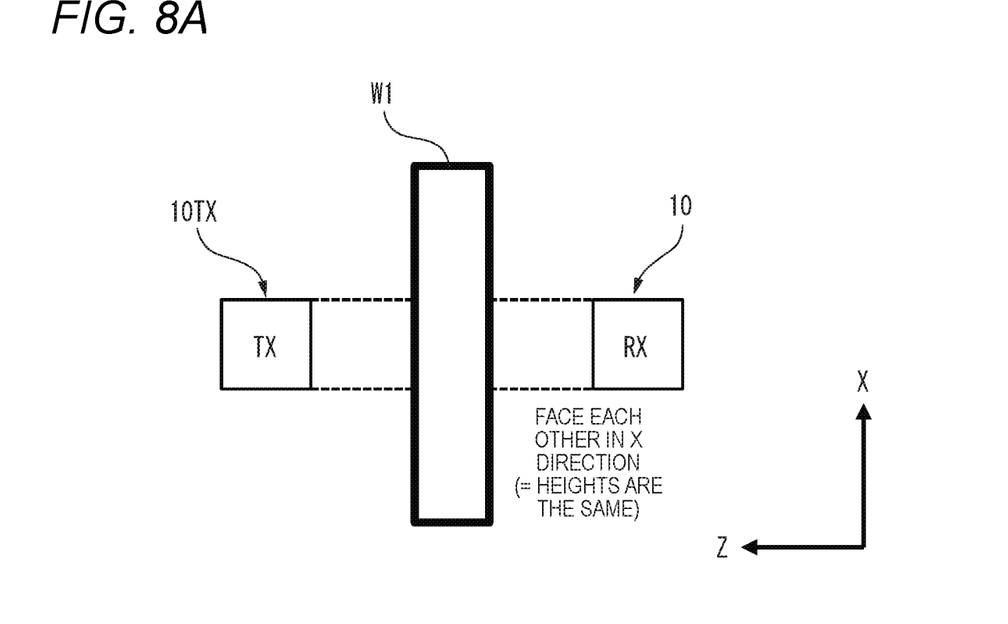
FIG. 8A is an XZ side view showing an example of the positional relationship between the transmitter and the receiver when the receiver is held at the proper position.
Figure 8B:
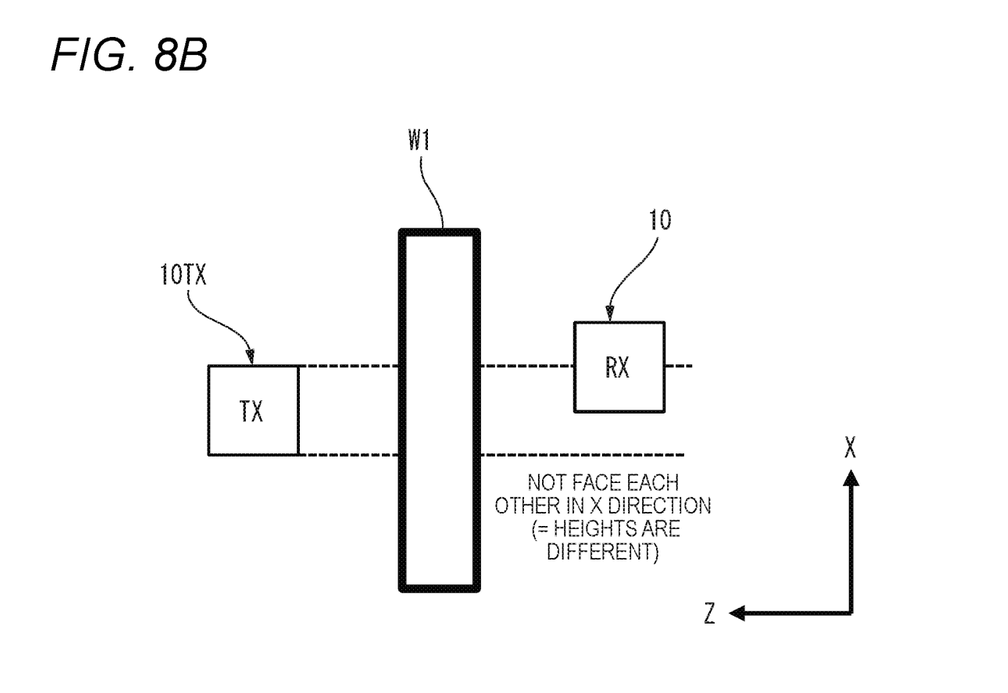
FIG. 8B is an XZ plan view showing an example of the positional relationship between the transmitter and the receiver when the receiver is not held at the proper position.

FIG. 7A is a YZ plan view showing an example of a positional relationship between the transmitter and the receiver when the receiver is held at the proper position. FIG. 7B is a YZ plan view showing an example of the positional relationship between the transmitter and the receiver when the receiver is not held at the proper position. FIG. 8A is an XZ side view showing an example of the positional relationship between the transmitter and the receiver when the receiver is held at the proper position. FIG. 8B is an XZ plan view showing an example of the positional relationship between the transmitter and the receiver when the receiver is not held at the proper position. XYZ axes are the same as XYZ axes shown in FIG. 3.

FIG. 7A shows a state where the wireless transmitter 10TX and the radio wave measurement apparatus 10 are arranged to face each other in a Y direction with the wall W1 sandwiched therebetween (in other words, no lateral deviation in the Y direction) in a YZ plan view. On the other hand, FIG. 7B shows a state where the wireless transmitter 10TX and the radio wave measurement apparatus 10 are not arranged to face each other in the Y direction with the wall W sandwiched therebetween in the similar YZ plan view. That is, as shown in FIG. 7B, in the YZ plan view, in a case where a three-dimensional coordinate space of the area ARE1 is considered, when a Y coordinate of the wireless transmitter 10TX and a Y coordinate of the radio wave measurement apparatus 10 do not coincide with each other, it can be said that the wireless transmitter 10TX and the radio wave measurement apparatus 10 are not arranged to face each other in the Y direction with the wall W1 sandwiched therebetween.

Similarly, a state where the wireless transmitter 10TX and the radio wave measurement apparatus 10 are arranged to face each other in an X direction with the wall Wi sandwiched therebetween (in other words, a state where there is no height deviation in the X direction) is shown in the XZ plan view. On the other hand, FIG. 8B shows a state where the wireless transmitter 10TX and the radio wave measurement apparatus 10 are not arranged to face each other in the X direction with the wall W sandwiched therebetween in the similar XZ plan view. That is, as shown in FIG. 8B, in the XZ plan view, in a case where the three-dimensional coordinate space of the area ARE1 is considered, when an X coordinate of the wireless transmitter 10TX and an X coordinate of the radio wave measurement apparatus 10 do not coincide with each other, it can be said that the wireless transmitter 10TX and the radio wave measurement apparatus 10 are not arranged to face each other in the X direction with the wall W1 sandwiched therebetween.

Figure 9:
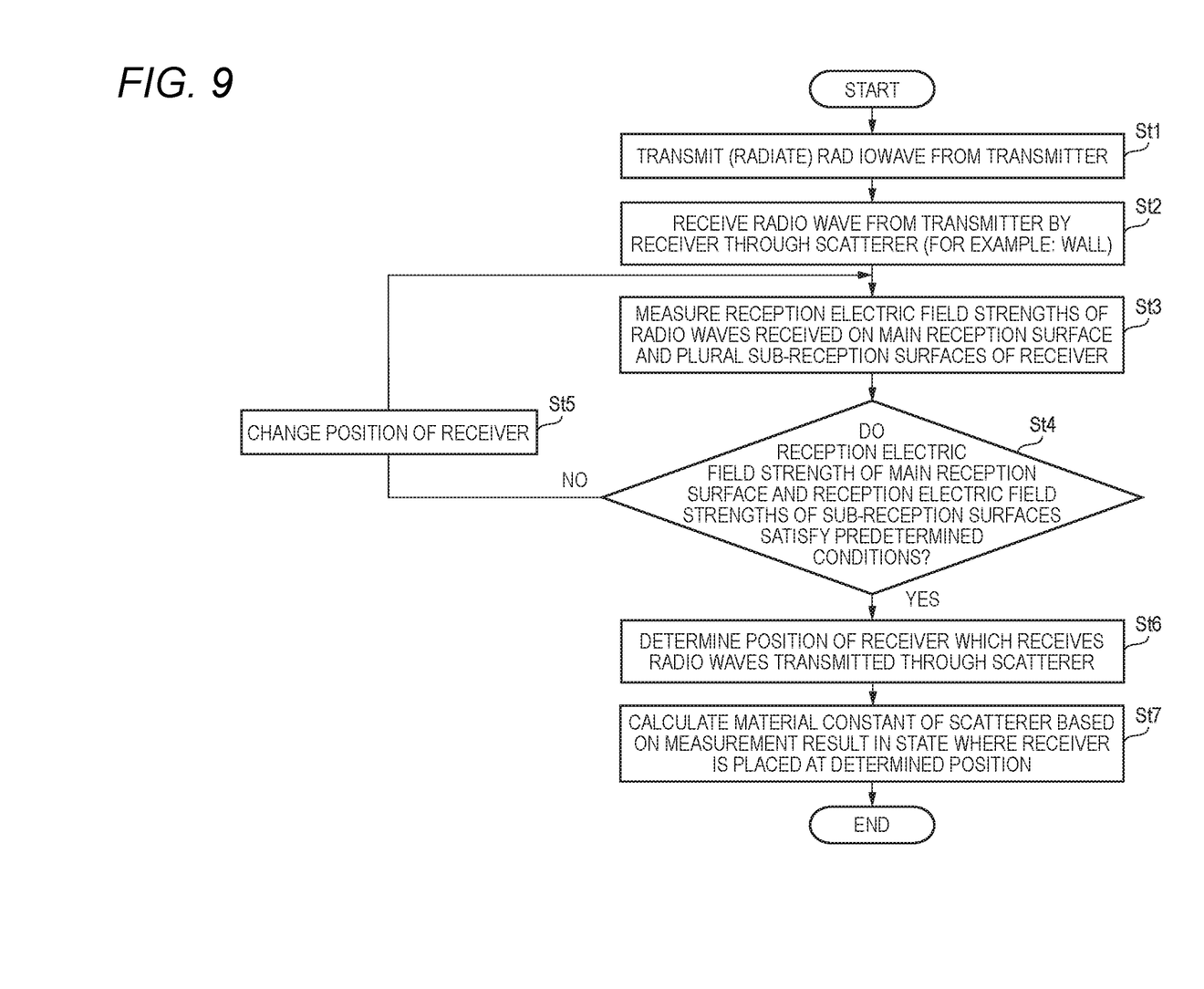
FIG. 9 is a flowchart illustrating an example of an operation procedure of the radio wave measurement method using the radio wave measurement apparatus according to the first embodiment as the receiver.

Next, a time-series operation procedure of the radio wave measurement method using the radio wave measurement apparatus 10 according to the first embodiment as the receiver will be described with reference to FIG. 9. FIG. 9 is a flowchart illustrating an example of the operation procedure of the radio wave measurement method using the radio wave measurement apparatus 10 according to the first embodiment as the receiver. As a premise of description shown in FIG. 9, the wireless transmitter 10TX that is an example of the transmitter and the radio wave measurement apparatus 10 that is an example of the receiver are arranged with the wall W1, which is the scatterer placed in the area ARE1, sandwiched therebetween.

In FIG. 9, the wireless transmitter 10TX transmits (radiates) radio waves having a frequency of, for example, 920 MHz band (St1). At a current arrangement position, the radio wave measurement apparatus 10 receives the radio waves transmitted from the wireless transmitter 10TX in step St1 through the scatterer (for example, the wall W1) (St2). The radio wave measurement apparatus 10 is connected to the PC via the USB port 7b. The PC measures reception electric field strengths of the radio waves received on the main reception surface and the plurality of sub-reception surfaces of the radio wave measurement apparatus 10 in step St2 (St3).

It is determined that whether the reception electric field strength of the main reception surface and the reception electric field strengths of the plurality of sub-reception surfaces measured by the PC in step St3 satisfy the predetermined conditions (see the above)(St4). The predetermined conditions are that, as described above, the reception electric field strength of the main reception surface is greater than each of the reception electric field strengths of other surfaces (that is, the sub-reception surfaces), and the differences of the reception electric field strengths of the sub-reception surfaces are within a predetermined value (for example, α1 shown in FIG. 6A).

When the predetermined conditions are not satisfied (St4, NO), the arrangement position of the radio wave measurement apparatus 10 is changed by a movement method, for example, the user moves the pedestal (not shown) (St5). Thereafter, the radio wave measurement apparatus 10 receives, at an arrangement position changed in step St5, the radio waves transmitted from the wireless transmitter 10TX through the scatterer (for example, the wall W1) (St2). The measurement device measures the reception electric field strengths of the radio waves received on the main reception surface and the plurality of sub-reception surfaces of the radio wave measurement apparatus 10 in step St2 (St3).

On the other hand, when the predetermined conditions are satisfied (St4, YES), a position of the radio wave measurement apparatus 10 where the radio waves are transmitted through the scatterer (for example, the wall W1) when the predetermined conditions are satisfied is determined (St6). Therefore, in a state where the radio wave measurement apparatus 10 is fixed to the position of the radio wave measurement apparatus 10 determined in step St6, a loss of the radio waves due to the transmission through the wall W1 is measured by the PC, so that a material constant of the wall W1 can be properly obtained (St7).

As described above, the radio wave measurement method according to the first embodiment uses the wireless transmitter 10TX that is an example of the transmitter and the radio wave measurement apparatus 10 that is an example of the receiver. The radio wave measurement apparatus 10 includes the housing of the polyhedron that includes one main reception surface on which the horizontally polarized wave antenna (an example of a reception antenna) and the vertically polarized wave antenna (an example of the reception antenna) are provided and the plurality of sub-reception surfaces on which different horizontally polarized wave antennas (an example of reception antennas) and vertically polarized wave antennas (an example of the reception antennas) are respectively provided. The radio wave measurement method includes a step of transmitting the radio waves from the wireless transmitter 10TX, and a step of receiving the radio waves by the radio wave measurement apparatus 10 through the scatterer (for example, the wall W1). The radio wave measurement method includes a step of changing the position of the radio wave measurement apparatus 10, and measuring, a plurality of times, reception qualities of the radio waves received by the reception antennas of the main reception surface and the reception antennas of the plurality of sub-reception surfaces. The radio wave measurement method includes a step of determining the position of the receiver when a reception quality of a radio wave corresponding to the reception antennas of the main reception surface and reception qualities of radio waves corresponding to the plurality of sub-reception surfaces satisfy the predetermined conditions as a measurement position used for derivation of the material constant of the scatterer (for example, the wall W1).

Accordingly, in the radio wave measurement method according to the first embodiment, since the proper position of the receiver that receives the radio waves from the transmitter through the scatterer disposed in the model area of the measurement target can be determined, the derivation of the material constant of the scatterer used in a simulation according to an actual environment as well as improvement in the simulation accuracy can be facilitated.

The radio wave measurement method further includes a step of measuring the reception quality of the radio wave corresponding to the reception antennas of the main reception surface and the reception qualities of the radio waves corresponding to the plurality of sub-reception surfaces by the PC connected to the radio wave measurement apparatus 10 and displaying both reception qualities by the display unit DP1. Accordingly, according to the radio wave measurement method, the user can easily confirm whether the wireless transmitter 10TX and the radio wave measurement apparatus 10 are positioned to face each other with the wall W1 sandwiched therebetween while visually confirming, on the display unit DP1, the reception quality of the radio wave corresponding to the reception antennas of the main reception surface and the reception qualities of the radio waves corresponding to the plurality of sub-reception surfaces.

The predetermined conditions are that the reception quality of the radio wave corresponding to the reception antennas of the main reception surface is greater than each of the reception qualities of the radio waves corresponding to the plurality of sub-reception surfaces, and differences of the reception qualities of the radio waves corresponding to the plurality of sub-reception surfaces are within a predetermined value. When the wireless transmitter 10TX and the radio wave measurement apparatus 10 are arranged to face each other with the wall W1 sandwiched therebetween, the radio waves transmitted through the wall W1 are mainly received on the main reception surface, and are received on other surfaces (that is, the plurality of sub-reception surfaces) by further going around from the main reception surface. Accordingly, when the predetermined conditions are satisfied, it can be determined that the wireless transmitter 10TX and the radio wave measurement apparatus 10 are positioned to face each other with the wall W1 sandwiched therebetween.

The polyhedron of the housing of the radio wave measurement apparatus 10 is a cube in which an area of the main reception surface and an area of each of the plurality of sub-reception surfaces are the same. Accordingly, since the main reception surface and the plurality of sub-reception surfaces have the same area, the horizontally polarized wave antenna and the vertically polarized wave antenna on each surface can be arranged in the same positional relationship. Therefore, measurement accuracy of the reception electric field strength of the radio waves of the measurement device can be improved.

Although the embodiment is described above with reference to the drawings, it is needless to say that the present disclosure is not limited to such examples. It will be apparent to those skilled in the art that various alterations, modifications, substitutions, additions, deletions, and equivalents can be conceived within the scope of the claims, and it should be understood that such changes also belong to the technical scope of the present disclosure. Each component in the various embodiments mentioned above may be combined arbitrarily in the range without deviating from the spirit of the invention.

This application is a continuation of PCT application No. PCT/JP2019/010116, which was filed on Mar. 12, 2019 based on Japanese Patent Application (No. 2018-056872) filed on Mar. 23, 2018, the contents of which are incorporated herein by reference.

The present disclosure is useful as the radio wave measurement method that determines the proper position of the receiver that receives the radio waves from the transmitter through the scatterer disposed in the model area of the measurement target, and facilitates the derivation of the material constant of the scatterer used in the simulation according to the actual environment as well as the improvement in the simulation accuracy.

What is claimed is:

1. A radio wave measurement method in which a transmitter and a receiver are used, the receiver comprising a housing of a polyhedron that includes one main reception surface and a plurality of sub-reception surface, wherein a reception antenna is provided on the one main reception surface and different reception antennas are provided on the plurality of sub-reception surface, the radio wave measurement method comprising:
    transmitting a radio wave from the transmitter;
    receiving the radio wave by the receiver through a scatterer;
    measuring, a plurality of times, reception qualities of the radio waves received by the reception antenna of the main reception surface and received respectively by the reception antennas of the plurality of sub-reception surfaces while changing a position of the receiver; and
    determining a position of the receiver when the reception quality of the radio wave corresponding to the reception antenna of the main reception surface and the reception qualities of the radio waves corresponding to the plurality of sub-reception surfaces satisfy a predetermined condition as a measurement position used for derivation of a material constant of the scatterer.

2. The radio wave measurement method according to claim 1, further comprising:
    measuring the reception quality of the radio wave corresponding to the reception antenna of the main reception surface and the reception qualities of the radio waves corresponding to the plurality of sub-reception surfaces by a measurement device connected to the receiver, and displaying both reception qualities on a display unit.

3. The radio wave measurement method according to claim 1, wherein the predetermined condition is that the reception quality of the radio wave corresponding to the reception antenna of the main reception surface is greater than the reception qualities of the radio waves corresponding to the plurality of sub-reception surfaces, and a difference between the reception qualities of the radio waves corresponding to the plurality of sub-reception surfaces is within a predetermined value.

4. The radio wave measurement method according to claim 1, wherein the polyhedron is a cube in which an area of the main reception surface and an area of each of the plurality of sub-reception surfaces are the same.

* * * * *